US008184123B2

(12) United States Patent
Nagase et al.

(10) Patent No.: US 8,184,123 B2
(45) Date of Patent: May 22, 2012

(54) IMAGE DISPLAY APPARATUS, IMAGE PROCESSING APPARATUS, AND IMAGE DISPLAY METHOD

(75) Inventors: Akihiro Nagase, Chiyoda-ku (JP); Jun Someya, Chiyoda-ku (JP); Yoshiteru Suzuki, Chiyoda-ku (JP); Akira Okumura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 885 days.

(21) Appl. No.: 12/155,887

(22) Filed: Jun. 11, 2008

(65) Prior Publication Data

US 2009/0309895 A1 Dec. 17, 2009

(30) Foreign Application Priority Data

Jun. 26, 2007 (JP) ................................ 2007-167591

(51) Int. Cl.

| | |
|---|---|
| ***G09G 5/02*** | (2006.01) |
| ***G09G 5/10*** | (2006.01) |
| ***H04N 5/202*** | (2006.01) |
| ***H04N 5/14*** | (2006.01) |
| ***H04N 1/46*** | (2006.01) |
| ***G06K 9/40*** | (2006.01) |
| ***G03F 3/08*** | (2006.01) |
| *G06K 9/00* | (2006.01) |
| *G06K 9/32* | (2006.01) |
| *H04N 5/00* | (2006.01) |

(52) U.S. Cl. ........ 345/589; 345/428; 345/600; 345/643; 345/690; 348/251; 348/254; 348/615; 348/671; 358/3.06; 358/519; 358/534; 358/461; 382/169; 382/254; 382/274; 382/300

(58) Field of Classification Search .................. 345/581, 345/428, 589, 596, 600–601, 606, 611–613, 345/618, 630, 643–644, 204, 690; 348/251–254, 348/405, 430, 538, 615, 668–671, 674, 701; 358/3.06, 1.9, 515–519, 525, 534, 448, 461
See application file for complete search history.

(56) References Cited

U.S. PATENT DOCUMENTS

| | | | | |
|---|---|---|---|---|
| 5,109,282 | A * | 4/1992 | Peli | 358/3.14 |
| 5,113,248 | A * | 5/1992 | Hibi et al. | 358/501 |
| 5,121,195 | A * | 6/1992 | Seki et al. | 358/515 |
| 5,189,529 | A * | 2/1993 | Ishiwata et al. | 358/451 |
| 5,852,502 | A * | 12/1998 | Beckett | 358/512 |
| 6,208,431 | B1 * | 3/2001 | Lee et al. | 358/1.9 |
| 2002/0171663 | A1 * | 11/2002 | Kobayashi et al. | 345/600 |

(Continued)

FOREIGN PATENT DOCUMENTS

JP 10-210391 A 8/1998

(Continued)

*Primary Examiner* — Wesner Sajous
(74) *Attorney, Agent, or Firm* — Birch, Stewart, Kolasch & Birch, LLP

(57) ABSTRACT

The object of the present invention is to provide an image display apparatus, an image processing apparatus, and an image display method that are able to display images without motion blur without increasing the transmitted amount of image signal. An image display apparatus of the invention comprises an image reception unit that receives an image signal; a gray-level correction unit that corrects image signals each corresponding to sub-frames consisting of a plurality of pixel groups split from the received mage signal, using respective grayscale characteristics different from sub-frame to sub-frame; and an image display unit that displays the frame image by successively displaying the sub-frame images each having been gray-level-corrected.

15 Claims, 13 Drawing Sheets

U.S. PATENT DOCUMENTS

| | | | | |
|---|---|---|---|---|
| 2005/0053291 | A1 | 3/2005 | Mishima et al. | |
| 2005/0104812 | A1 * | 5/2005 | Ohshima | 345/60 |
| 2006/0061600 | A1 * | 3/2006 | Beuker et al. | 345/656 |
| 2007/0188411 | A1 * | 8/2007 | Takada et al. | 345/63 |
| 2007/0205969 | A1 * | 9/2007 | Hagood et al. | 345/84 |
| 2008/0048942 | A1 * | 2/2008 | Ishida et al. | 345/63 |
| 2008/0211749 | A1 * | 9/2008 | Weitbruch et al. | 345/77 |

FOREIGN PATENT DOCUMENTS

| | | | |
|---|---|---|---|
| JP | 2003-259253 | A | 9/2003 |
| JP | 2004-357215 | A | 12/2004 |
| JP | 2006-58891 | A | 3/2006 |

* cited by examiner

IMAGE DISPLAY APPARATUS, IMAGE PROCESSING APPARATUS, AND IMAGE DISPLAY METHOD

BACKGROUND OF THE INVENTION

1. Field of the Invention

The present invention relates to image display apparatuses, image processing apparatuses, and image display methods.

2. Description of the Prior Art

Display devices such as liquid crystal displays, plasma displays, electroluminescence (EL) displays, and digital mirror devices (DMD), which modulate, by mirror reflection or optical interference, pixels discretely arranged in a matrix to display images, are employed in various image display apparatuses such as flat-panel televisions and projection televisions as well as projectors and monitors for computers. These display devices having pixels arranged in a matrix can be classified into a hold type display that uses a liquid crystal or EL with an active matrix drive circuit and a pulse-width-modulation type display that uses plasma or a DMD to produce gray-levels by varying duration of illumination or exposure, which are distinguished from an impulse type display that uses a cathode ray tube (cold cathode ray tube or Braun tube). In the hold type display and the pulse-width-modulation type display, when motion pictures are viewed, deterioration in image quality—most notably as motion blur—may sometimes occur due to deviation between movements of the display-position of a moving object and the human viewpoint. Hence, an image processing method has been disclosed for improving such displays, in which interpolated frames are interposed between temporally neighboring frames to improve image quality (for example, refer to Japanese Patent Application Publication No. 2004-357215, par. [0017] and FIG. 2).

In recent years, on the other hand, a wide spread of high-definition broadcasting and a significant increase in computer processing speed have propelled displays to rapid progress toward high definition. While display devices have also developed toward high definition along with these movements, the progress of display devices toward high definition not only needs high processing accuracy but also is a factor that contributes to increasing manufacturing costs due to reduction in yield and the like. In such situation, a method has been disclosed in which a high-definition image is displayed by an image display unit having fewer pixels than those contained in an inputted image using a display technique of pixel shifting or wobbling (for example, refer to Japanese Patent Application Publication No. H10-210391, par. [0018] and FIG. 3).

The image processing method that interposes interpolated frames as described above needs to increase the number of images displayed per second by increasing the frame frequency. For that reason, there has been a problem that causes increase of the transmission amount of image signal and complexity of the circuit configuration.

In particular, employing a display technique of shifting pixels in such image processing method needs to generate split sub-frames of interpolated frames for the pixel shifting, which has posed a problem that causes, to a greater extent, increase of the transmission amount of image signal and complexity of the circuit configuration.

SUMMARY OF THE INVENTION

The present invention is made in light of the above problems, and an object of the invention is to provide an image display apparatus, an image processing apparatus, and an image display method that are able to display images without motion blur without increasing the amount of image signal transmission.

An image display apparatus according to an aspect of the invention displays a frame image by successively displaying sub-frame images consisting of a plurality of respective pixel groups split from the frame image, and comprises an image reception unit for receiving an image signal; a gray-level correction unit for correcting image signals each being split from the received image signal and corresponding to the sub-frames, using respective grayscale characteristics different from sub-frame to sub-frame; and an image display unit for displaying the sub-frame images of the image signals having been corrected by using the respective different grayscale characteristics.

An image display apparatus according to another aspect of the invention performs using a display technique of pixel shifting a high density display of the received image signal by an image display unit having fewer pixels than those in the received image signal, and comprises a sampling unit having at least two sampling phases different from each other, for sampling at the sampling phases from the received image signal, second image signals each having the same number of pixels as the image display unit, wherein the image display unit displays, using the pixel shifting, image signals having been corrected from the second image signals by using the respective different grayscale characteristics, as image signals corresponding to the respective sub-frame images.

An image display apparatus according to still another aspect of the invention further comprises an image combining unit for combining the image signals each having been corrected from the second image signals by using the respective different grayscale characteristics, to output the combined image signal, wherein the image display unit splits the combined image signal combined by the image combining unit into a plurality of third image signals each having the same number of pixels as the image display unit, to display using the pixel shifting the third signals as image signals corresponding to the respective sub-frame images.

An image processing apparatus according to the invention is adapted for an image display apparatus that performs a high density display using a display technique of pixel shifting by an image display unit having fewer pixels than those in a received image signal, and comprises a sampling unit having at least two sampling phases different from each other, for sampling at the sampling phases from the received image signal, second image signals each having the same number of pixels as the image display unit; a gray-level correction unit for correcting the second image signals using respective grayscale characteristics different from each other; and an image combining unit for combining the image signals having been corrected from the respective second image signals, to output third image signals constituting one frame image.

An image display method according to the invention displays a frame image by successively displaying sub-frame images consisting of a plurality of respective pixel groups split from the frame image, and comprises an image reception step of receiving an image signal; a gray-level correction step of correcting image signals each being split from the image signal received in the image reception step and corresponding to the sub-frames using respective grayscale characteristics different from sub-frame to sub-frame; and an image display step of displaying the sub-frame images of image signals having been corrected by using the respective different grayscale characteristics.

According to an image display apparatus, an image processing apparatus, and an image display method of the present invention, images are displayed using sub-frames being subject to gray-level corrections having characteristics different from each other. The images can thereby be displayed even with a smaller number of pixels, i.e., fewer pixels to be transmitted to the image display unit per unit time, without reducing quality of moving images.

DETAILED DESCRIPTION OF THE PREFERRED EMBODIMENTS

Embodiment 1

Figure 1:
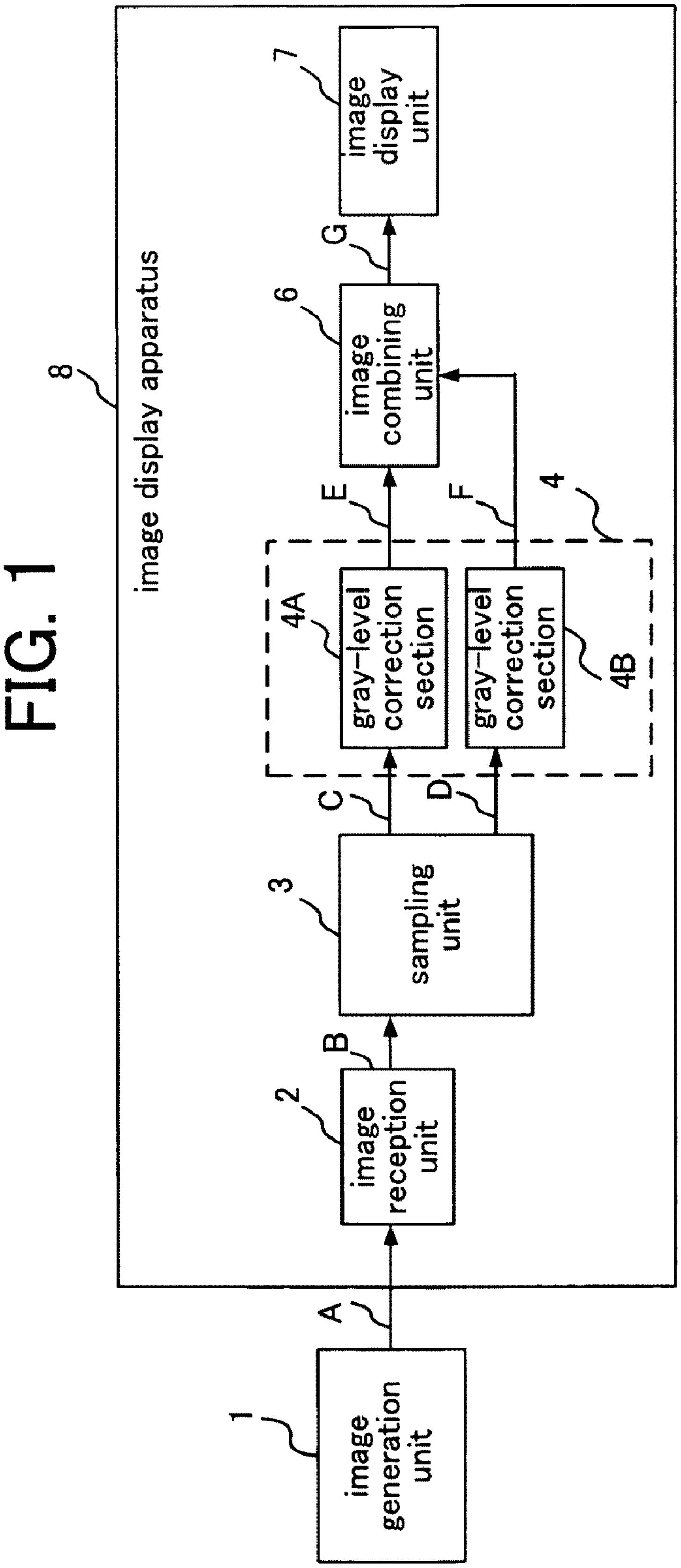
FIG. 1 is a block diagram illustrating a configuration of an image display apparatus according to Embodiment 1 of the present invention.

FIG. 1 is a block diagram illustrating a configuration of an image display apparatus 8 according to the present invention. In addition to the image display apparatus 8, an image generation unit 1 is shown in FIG. 1, which is disposed outside the image display apparatus 8 and generates images to be displayed thereby. The image generation unit 1 transmits the image signal to the image display device 8 by outputting the signal in an analog or a digital form through an electrically connected cable, or by outputting the image signal using a radio wave, light, or the like.

The configuration of the image display apparatus as well as individual processes thereof will be explained below.

Image Reception Process

An image signal A outputted by the image generation unit 1 is inputted into an image reception unit 2 of the image display apparatus 8. The image reception unit 2 converts the received image signal A into image data to be subsequently processed. The conversion is performed in accordance with a transmission form of the image signal A: for example, an analog-to-digital conversion when the image signal A is an analog signal and a serial-to-parallel conversion when the image signal A is a serial digital image signal are conceivable. In addition, when a received image signal includes luminance and chrominance components, the image signal may be converted to an image signal including color signals such as red, green, and blue.

Sampling Process

An image signal B outputted from the image reception unit 2 is inputted into a sampling unit 3. The sampling unit 3 generates image signals C and D by resampling them on a predetermined pixels basis at different sampling phases from the image signal B corresponding to one frame image. In other words, the image signals C and D are generated by being resampled so that the image signal B is split thereinto. Here, the image signals C and D each are resampled to have pixels the number of which is that of pixels displayed in a display device used in an image display unit 7, which will be described later, so that the signals each contain fewer pixels than those in the image signal B. For example, when the image display unit 7 has half the number of pixels as that of pixels in the inputted image signal A, the sampling unit 3 generates the image signals C and D by sampling them from the signal B with half the sampling number of pixels as that of pixels contained therein. Moreover, by varying the sampling phases for the image signals C and D, full image information in the image signal B can be split into the image signals C and D.

Gray-Level Correction Process

A gray-level correction unit 4 includes two gray-level correction sections 4A and 4B, and the image signals C and D outputted from the sampling unit 3 are inputted into the gray-level correction sections 4A and 4B, respectively. The gray-level correction unit 4 performs a grayscale-conversion of the inputted image signals C and D in accordance with respective lookup tables (hereinafter, referred to as LUTs) having predetermined grayscale characteristics different from each other, to output the converted signals as image signals E and F, respectively.

Image combining Process

An image combining unit 6 generates a combined image signal G to reconstruct one frame image, by spatially combining the image signals E and F that have been resampled by the sampling unit 3 and grayscale-converted by the gray-level correction unit 4.

Image Display Process

The combined image signal G combined by the image combining unit 6 is transmitted to the image display unit 7. The image display unit 7 splits according to a predetermined processing the combined image signal G into image signals H corresponding to a plurality of sub-frame images, to display images corresponding to the original frame by successively displaying the plurality of split sub-frame images with display positions of their pixels being shifted.

The processing of image signals in each process described above will be explained in detail below.

Figure 2:
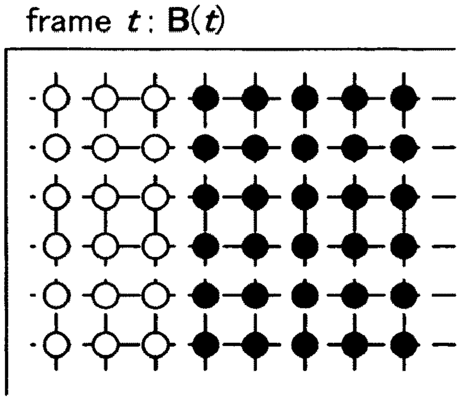
FIG. 2 is an illustration for explaining an image signal B in the image display apparatus according to Embodiment 1 of the invention.

FIG. 2 illustrates part of the image signal B(t) outputted by the image reception unit 2 at a frame t in the image reception process. The circle marks on the cross points of the dashed straight lines each represent a pixel.

Figure 3:
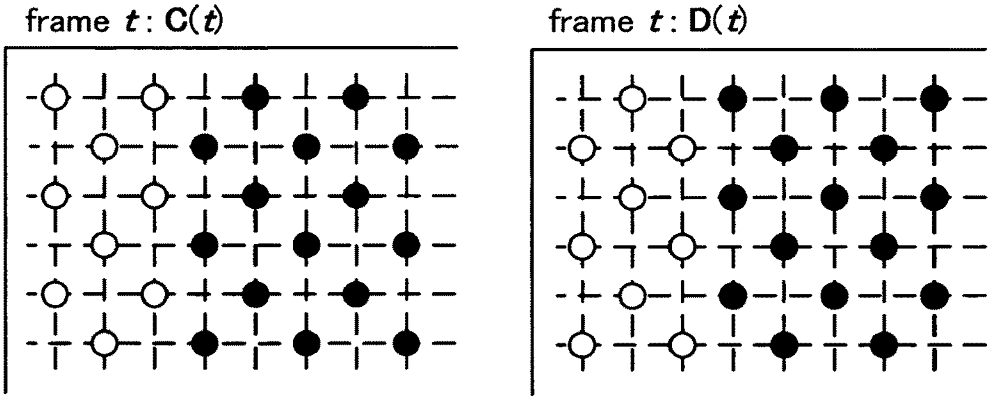
FIG. 3 shows illustrations for explaining image signals C and D in the image display apparatus according to Embodiment 1 of the invention.

FIG. 3 illustrates parts of pixels resampled by the sampling unit 3 from the image signal B(t) at the frame t, which is shown in FIG. 2, in the sampling process. Expressing each pixel in the image signal B(t) as Pb(x, y, t), pixels sampled as the image signals C(t) and D(t) are given as below:

$$Pb(x,y,t)=(2(n-1)+(y\%2),y,t) \text{ and}$$

$$Pb(x,y,t)=(2(n-1)+((y+1)\%2),y,t), \text{ respectively,}$$

where n is an integer more than or equal to one, and (a % b) denotes a residue when a is divided by b.

Figure 4:
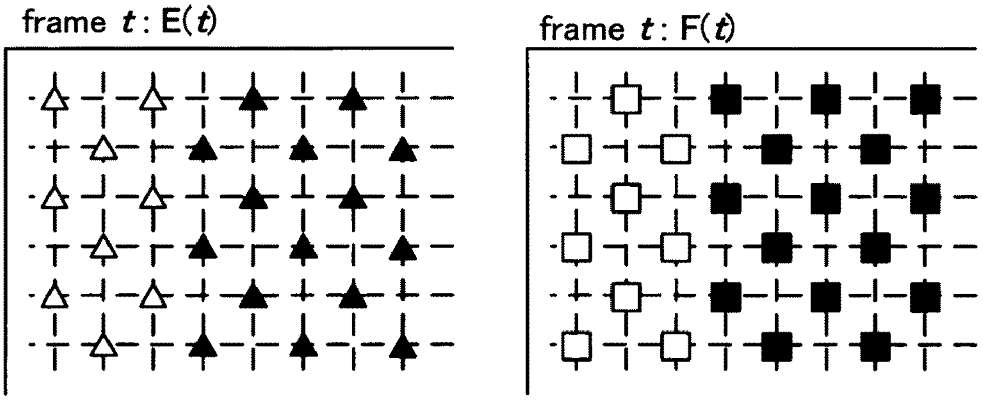
FIG. 4 shows illustrations for explaining image signals E and F in the image display apparatus according to Embodiment 1 of the invention.

FIG. 4 illustrates parts of the image signals E(t) and F(t) outputted by the gray-level correction unit 4 in the gray-level correction process. The gray-level correction unit 4 performs in accordance with the respective LUTs prepared in advance the grayscale-conversion of the inputted image signals C(t) and D(t), to output the image signals E(t) and F(t), respectively.

Figure 5:
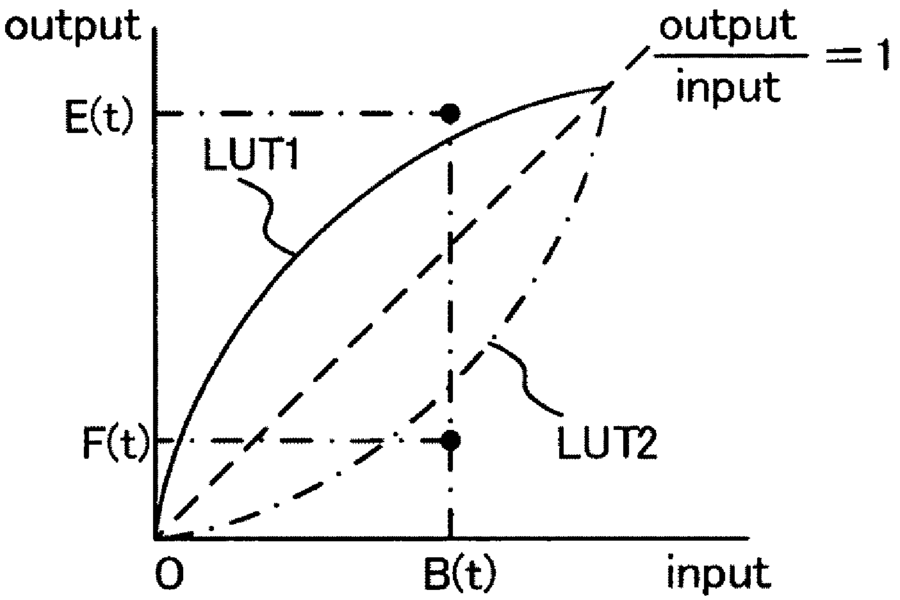
FIG. 5 is a chart for explaining grayscale characteristics of gray-level corrections in the image display apparatus according to Embodiment 1 of the invention.

FIG. 5 shows an example of characteristics of the LUTs that the gray-level correction unit 4 refers to. A gray-level correction performed in the gray-level correction section 4A by referring to an LUT1 indicated by the solid line has a characteristic that makes halftones in an inputted signal brighter. A gray-level correction performed in the gray-level correction section 4B by referring to an LUT2 indicated by the dashed-dotted line, in contrast, has a different grayscale characteristic that makes halftones in an inputted signal darker.

For example, the image signal B(t) received at a frame t in the image reception unit 2 is assumed to be an image signal of a constant gray-level B(t). In this case, the image signals C(t) and D(t) resampled by the sampling unit 3 also become image signals each having the constant gray-level B(t) as below:

$$C(t)=D(t)=B(t).$$

Performing the grayscale conversion of the image signals C(t) and D(t) in the gray-level correction sections 4A and 4B, respectively, the image signal C(t) inputted into the gray-level correction section 4A is corrected to a brighter gray-level E(t) because of reference to the LUT1; on the other hand, the image signal D(t) inputted into the gray-level correction section 4B is corrected to a darker gray-level F(t) because of reference to the LUT2:

$$F(t)<B(t)<E(t).$$

It is noted here that the larger a gray-level value is, the brighter its image is.

Figure 6:
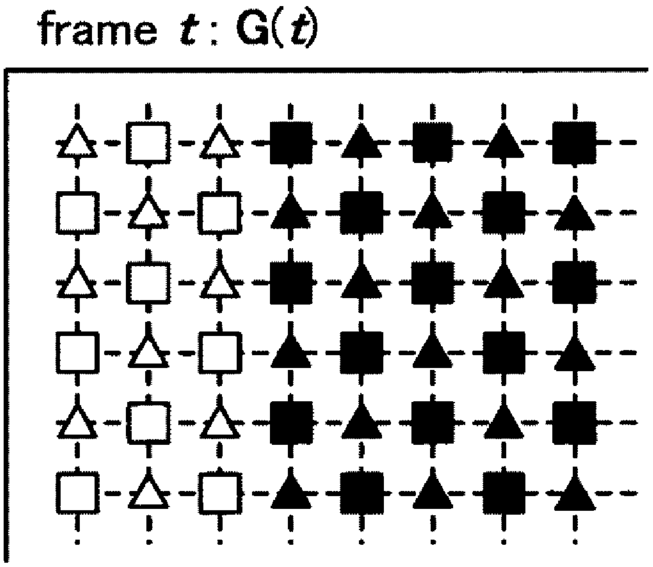
FIG. 6 is an illustration for explaining an image signal G in the image display apparatus according to Embodiment 1 of the invention.

FIG. 6 illustrates the combined image signal G(t) outputted by the image combining unit 6 in the image combining process. Pixel groups of image signals E(t) and F(t) outputted from the gray-level correction sections 4A and 4B, respectively, each are spatially combined and outputted to the image display unit 7 as the combined image signal G(t) corresponding to one frame image.

Figure 7:
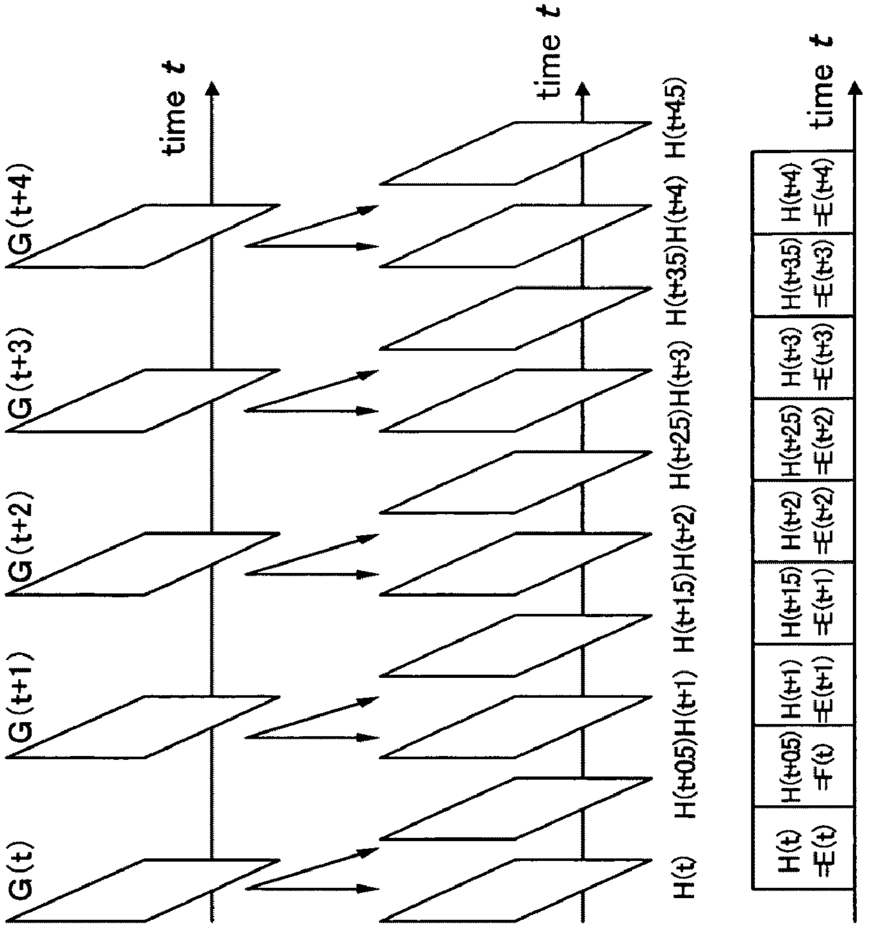
FIG. 7 is an illustration for explaining an operation of an image display unit in the image display apparatus according to Embodiment 1 of the invention.

FIG. 7 illustrates timings of displaying the combined image signal G with pixels being shifted, by the image display unit 7 in the image display process. As shown in FIG. 7, the image display unit 7 splits the inputted combined image signal G into image signals H(t) and H(t+0.5), to successively display them as two split sub-frames. Thus, at the timing of the sub-frame corresponding to the image signal H(t), pixels in the image signal G(t), which are indicated by the triangle marks in FIG. 6, are displayed; and at the timing of the sub-frame corresponding to the image signal H(t+0.5), pixels indicated by the square marks in FIG. 6 are displayed. In other words, at the timing of the image signal H(t), the same image as that when using the image signal E(t) shown in FIG. 4 is displayed, and at the timing of the image signal H(t+0.5), the same image as that when using the image signal F(t) shown in FIG. 4 is displayed. That is, at the timing of the H(t) frame, an image is displayed with its halftones having been corrected to be brighter, and at the timing of the H(t+0.5) frame, in contrast, an image is displayed with its halftones having been corrected to be darker.

Figure 8:
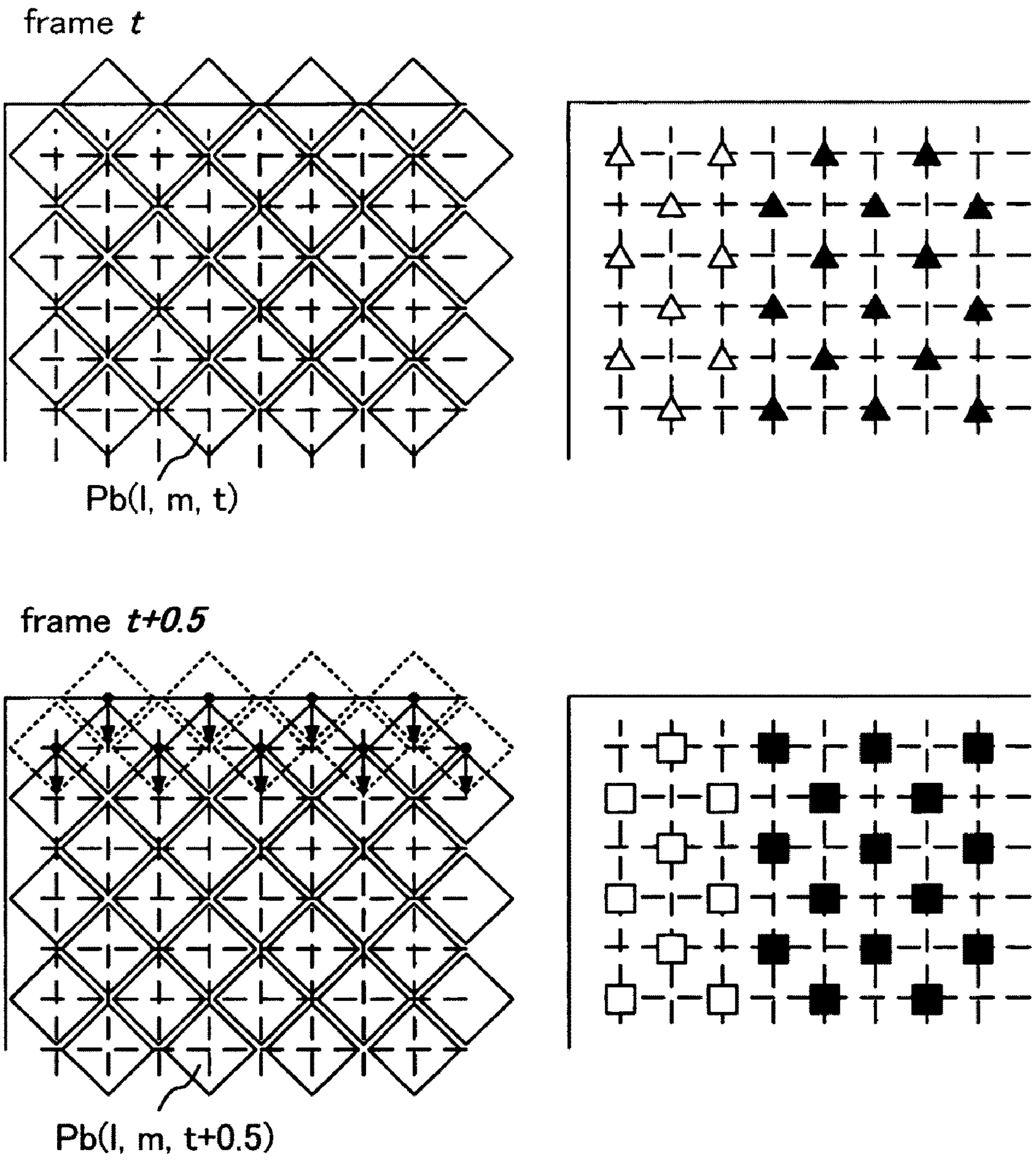
FIG. 8 shows illustrations for explaining the operation of the image display unit in the image display apparatus according to Embodiment 1 of the invention.

FIG. 8 illustrates a method of displaying the combined image signal G(t) with pixels being shifted, by the image display unit 7. Pixels displayed by the image display unit 7 are shown on the left of the figure, and on the right thereof, the pixels are shown that are split into two-sub-frames by the image display unit 7 from the combined image signal G(t) combined by the image combining unit 6.

The image display unit 7, as shown in FIG. 8, has half the number of pixels as that in the combined image signal G. Here, a case is shown in which half pixels of an inputted image signal are arranged in a staggered grid pattern. For example, when pixels are displayed at a frame t in positions shown on the top left of FIG. 8, pixels are to be displayed at the frame t+0.5 in positions shifted downwards by one row. At that time, the image display unit 7 extracts from the inputted combined image signal G, pixels each expressed by $$Pb=(2(n-1)+(y\%2),y,t)$$

and pixels each expressed by $$Pb=(2(n-1)+((y+1)\%2),y,t),$$

to display them as the image signal H(t) corresponding to a first sub-frame (sub-frame t) and as the image signal H(t+0.5) corresponding to a second sub-frame (sub-frame t+0.5), respectively. Here, n is an integer more than or equal to one, and (a % b) denotes a residue when a is divided by b.

In this way, one frame image of the combined image signal G(t) is split into two sub-frames t and t+0.5 to be displayed by the display image unit 7 in coordination with the pixel shifting operation thereof.

Figure 9:
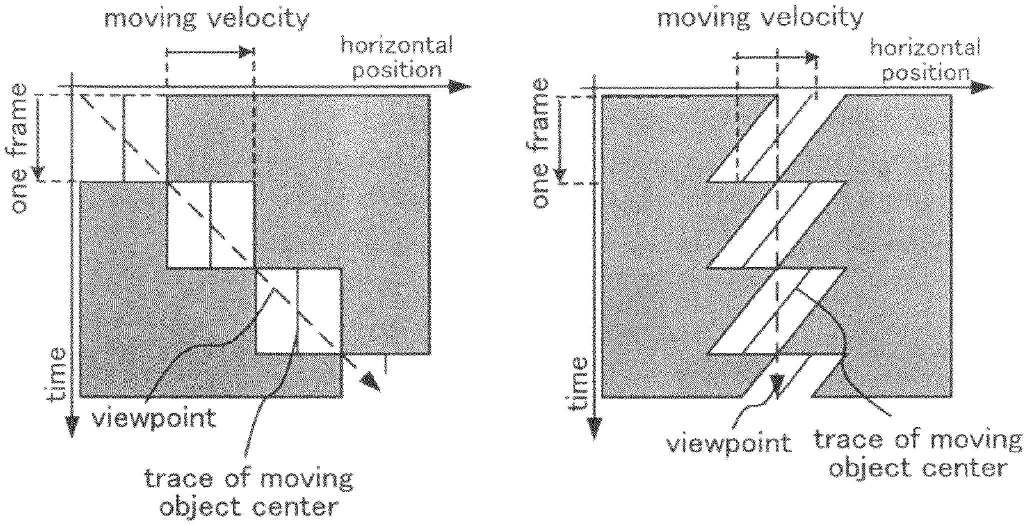
FIG. 9 shows illustrations for explaining a characteristic of visual recognition of moving images in a conventional image display apparatus.

FIG. 9 illustrates the principle how a motion blur is visually recognized in a hold type display device.

In the hold type display device, when a white object is displayed moving from the left to the right on a black background, a relation between time and display positions of the white object are illustrated on the left of FIG. 9. The horizontal and vertical axes denote horizontal positions on the display device and time, respectively. The solid lines indicate the center position of the white object, which expresses that the white object, while it is displayed at the same position during one frame period, moves like a frame-by-frame advance on a frame basis. The dashed-line arrows indicate movements of the viewpoint. With increase of the frame advance speed to some extent, the human eye smoothly follows the white object as if it actually moves.

A movement of the white object image on the retina with respect to a horizontal position is illustrated on the right of FIG. 9. The center position of the object swings left and right on the retina, so that the object movement is visually recognized as a motion blur as a result of the amount of swing being integrated.

Figure 10:
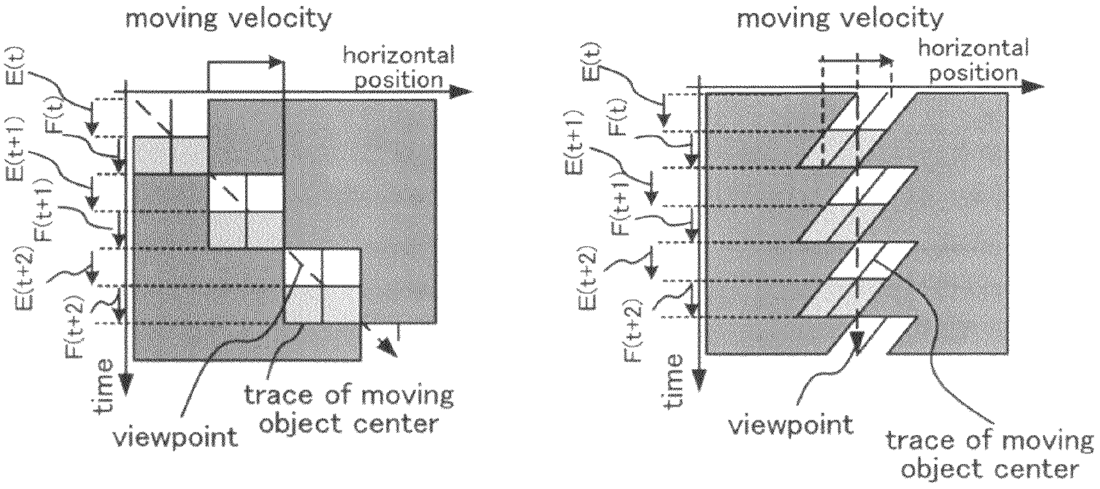
FIG. 10 shows illustrations for explaining a characteristic of visual recognition of moving images in the image display apparatus according to Embodiment 1 of the invention.

FIG. 10 illustrates the principle how a motion blur occurs when the combined image signal G is displayed using the pixel shifting operation in the image display unit 7, which signal is obtained in the image combining unit 6 by combining the image signals E and F that have been gray-level-corrected, using the respective grayscale characteristics different from each other, in the gray-level correction sections 4A and 4B from the image signals C and D, respectively, that are split by being resampled from the received image signal B in the sampling unit 3.

Since in the image display unit 7 a frame image corresponding to the combined image signal G is split into two sub-frame images to be displayed with the pixel shifting being performed, the image signal E having been corrected to an brighter image in the gray-level correction section 4A and the image signal F having been corrected to an darker image in the gray-level correction section 4B are displayed one after another during the half cycle of the received image signal B.

If the object has the same moving speed in FIGS. 9 and 10, since the display time of the brighter image is shortened in the case shown in FIG. 10, the integrated amount of left and right swing of the object center position on the retina becomes less in comparison with that in the case shown in FIG. 9, which results in reduction in the amount of motion blur being visually recognized.

In the method that splits one frame into sub-frames to display in the image display unit 7, one sub-frame image, as a matter of course, decreases in resolution in comparison with the one frame image. In particular, when the image signal A includes motion pictures, since their displayed images are different from sub-frame to sub-frame, a high definition due to the temporally integrating effect of the eye would not be expected.

However, when moving images are actually viewed, a spatial resolution of the eye also decreases because the viewpoint moves following the object in the images, so that the high definition is not very necessary. Moreover, the amount of motion blur, which is a specific problem with hold type and pulse-width-modulation type display devices, can be reduced in the present invention, so that performance of displaying motion pictures can be improved.

As explained above, by sampling a plurality of pixel groups to split an inputted image signal thereinto and by displaying at different timings each pixel group after having been gray-level-corrected by using respective grayscale characteristics different from each other, image quality in displaying motion pictures can be improved without increasing the transmission amount of image signal to be transmitted to an image display unit per unit time.

While in Embodiment 1 the explanation is made on the case in which one frame image is split into two pixel groups i.e., two sub-frame images to display each of them using a display technique of pixel shifting, in order to obtain the effect of reducing motion blur, it is not necessary to limit to an image display apparatus that uses a display technique of pixel shifting. For example, in a case of displaying images using an interlace method that constructs one frame image with two successive fields (sub-frames), by performing a gray-level correction on a field (sub-frame) basis using grayscale characteristics different from each other, image quality in displaying motion pictures, as described above, can be improved without increasing the amount of image signal to be transmitted to an image display unit per unit time. In this case, since an image signal is received in a state of originally separated fields (sub-frames), the output of the image reception unit 2 may be inputted directly into the gray-level correction unit 4 with the sampling unit 3 being eliminated, as long as the gray-level correction unit 4 can sample by itself image signals in synchronism with the timings of the fields (sub-frames).

Moreover, for an image display apparatus, which uses a conventional display technique of image shifting, having an image display unit 7 that is able to display images using a display technique of pixel shifting by splitting a given one frame of a combined image signal G(t) into image signals H(t) and H(t+0.5) corresponding to sub-frames, an image display apparatus 8 of Embodiment 1 can be obtained by adding to the circuit of the image display apparatus an image processing apparatus having the sampling unit 3, the gray-level correction unit 4, and the image combining unit 6.

In addition, in a case of using for the image display unit 7 a display unit having in itself no function of splitting the combined image signal G, the image signals E and F may be directly outputted from the gray-level correction unit 4 to the display unit, with the image combining unit 6 being eliminated. In this case, the image shifting operation, as a matter of course, needs to be synchronized with the image signals E and F.

While in Embodiment 1 the explanation is made on the case in which the resampling phase number in the sampling unit 3 and the split number of sub-frames in the image display unit 7 are both two, the effect of the invention is brought about in cases not limited to that: the same effect, as a matter of course, can be brought about even in a case of using both numbers being more than two, for example, the phase number of resampling being four.

In other words, according to the Embodiment 1, the image display apparatus 8 that displays a frame image by successively displaying sub-frame images consisting of a plurality of respective pixel groups split from the frame image, comprises the image reception unit 2 that receives the image signal A; the gray-level correction unit 4 that corrects using grayscale characteristics different from sub-frame to sub-frame the image signals C and D each corresponding to the sub-frames and split from the signal A received by the image reception unit 2 or from the image signal B converted from the signal A; and the image display unit 7 that displays the sub-frame images of the image signals corrected by using the respective different grayscale characteristics. Therefore, image quality in displaying motion pictures can be improved without increasing the amount of image signal transmitted per unit time.

In particular, the image display unit 8 that performs using a display technique of pixel shifting a high density display of the received image signal A by the image display unit 7 having fewer pixels than those in the received image signal A, comprises the sampling unit 3 that has at least two sampling phases different from each other and samples at the sampling phases from the received image signal B, second image signals C and D each having the same number of pixels as the image display unit 7, wherein the image display unit 7 displays using the pixel shifting the image signals E and F having been corrected from the second image signals by using the respective different grayscale characteristics, as image signals corresponding to the respective sub-frame images. Therefore, without increasing the amount of image signal transmitted per unit time, a high resolution can be achieved and image quality in displaying motion pictures can be improved.

Moreover, the image combining unit 6 is further included that combines the image signals E and F having been corrected by using the respective grayscale characteristics different from each other, to output the combined image signal G, and the image display unit 7 splits the combined image signal G(t) combined by the image combining unit 6 into the plurality of third image signals H(t) and H(t+0.5) each having the same number of pixels as the image display unit 7, to display using the pixel shifting the third image signals as image signals corresponding to the respective sub-frames images. Therefore, by adding only the image combining unit 6 to an image display apparatus having been already provided with the image display unit 7 having the display function of shifting pixels, a high resolution can be achieved and image quality in displaying motion pictures can also be improved without increasing the amount of image signal transmitted to the image display unit per unit time.

Furthermore, since the different sampling phases of the sampling unit 3 correspond to display pixel positions of the respective sub-frames displayed by the image display unit 7 using the pixel shifting, an image of a received image signal can be properly displayed as an image of high density and high definition by the image display unit 7 having fewer pixels than those in the received image signal.

Furthermore, since at least one of the grayscale-conversion characteristics different from each other is a characteristic that makes halftones in an inputted image signal brighter and at least another one is a characteristic that makes the halftones darker, the integrated amount of swing of an object on the retina, when motion pictures are displayed, is effectively suppressed and the amount of motion blur is reduced, so that image quality can be improved.

Embodiment 2

Figure 11:
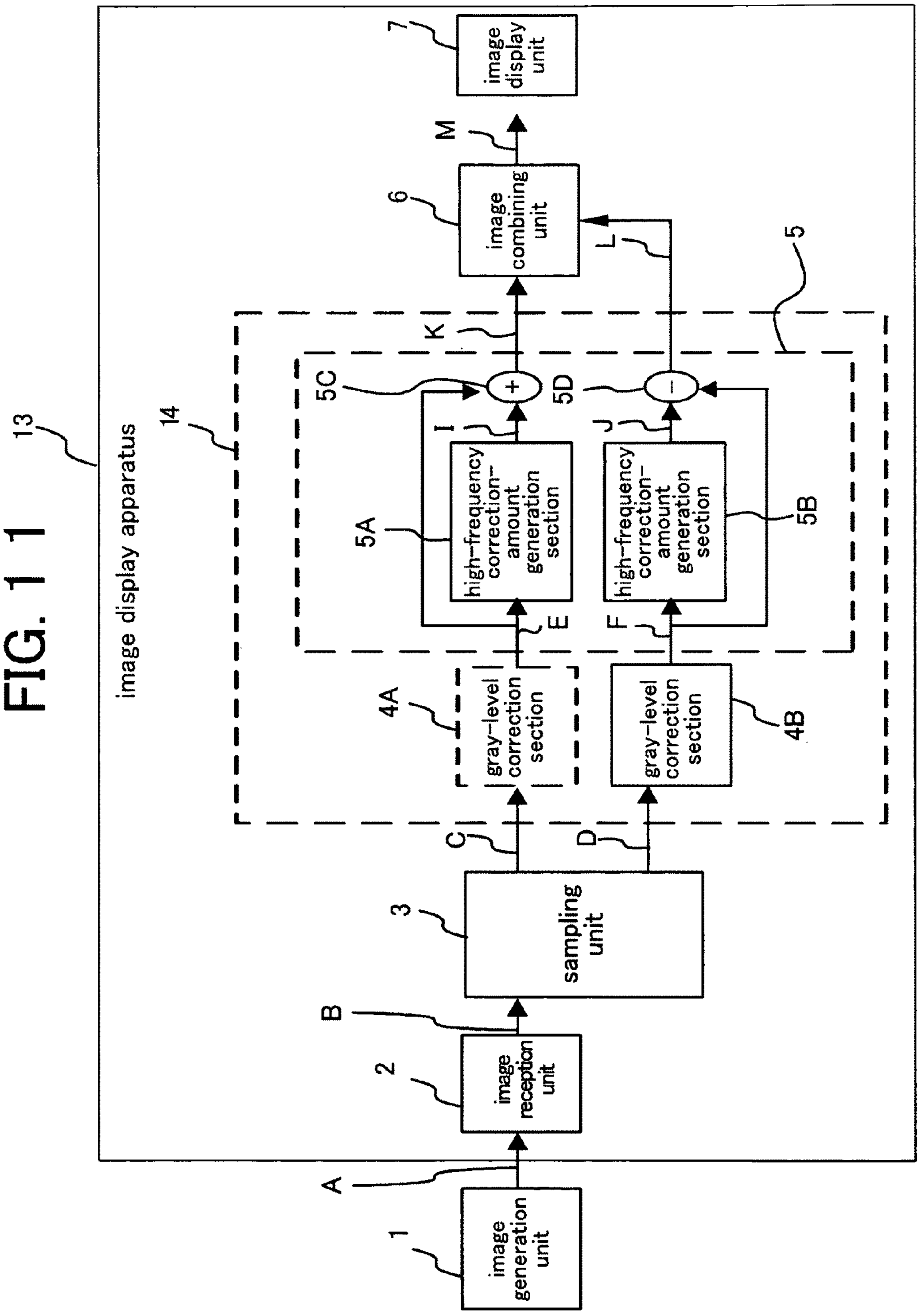
FIG. 11 is a block diagram illustrating an image display apparatus according to Embodiment 2 of the present invention.

FIG. 11 is a block diagram illustrating a configuration of another image display apparatus 13 according to the present invention. The difference from FIG. 1 in Embodiment 1 is in that a gray-level correction unit 14 is further provided with a high-frequency correction unit 5 having high-frequency correction-amount generation sections 5A and 5B, into which the image signals E and F are inputted, at the stage subsequent to the gray-level correction sections 4A and 4B, respectively, and having an adder 5C that adds together the image signal E and an image signal I outputted from the high-frequency correction-amount generation section 5A and a subtracter 5D that subtracts from the image signal F an image signal J outputted from the high-frequency correction-amount generation section 5B. Other constituents are the same as those of Embodiment 1; their explanations are therefore omitted.

Operations from the image generation unit 1 to the gray-level correction sections 4A and 4B are also the same as those of Embodiment 1; the explanations for the common operations are omitted.

Figure 12:
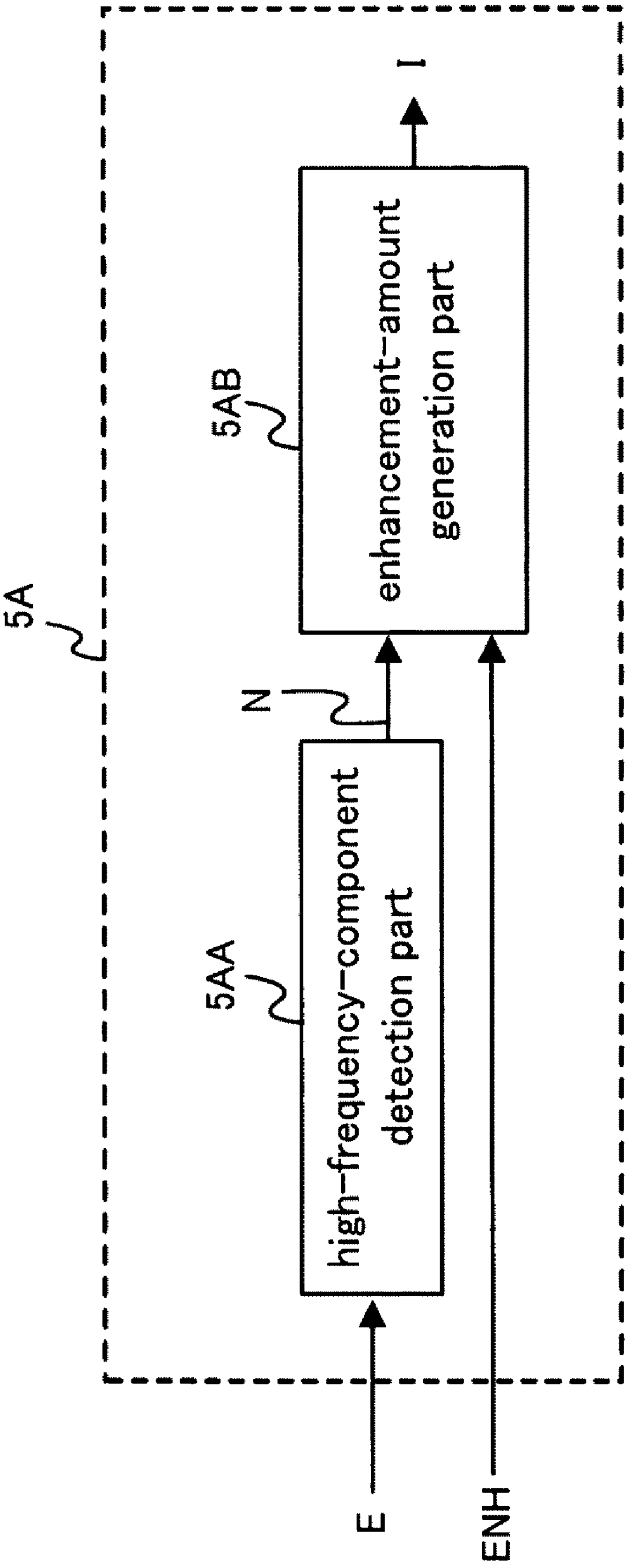
FIG. 12 is a block diagram for explaining in detail a high-frequency correction unit in the image display apparatus according to Embodiment 2 of the invention.

FIG. 12 is a block diagram illustrating in detail the high-frequency correction-amount generation section 5A included in the high-frequency correction unit 5. The high-frequency correction-amount generation section 5A has a high-frequency-component detection part 5AA and an enhancement-amount generation part 5AB.

Figure 13:
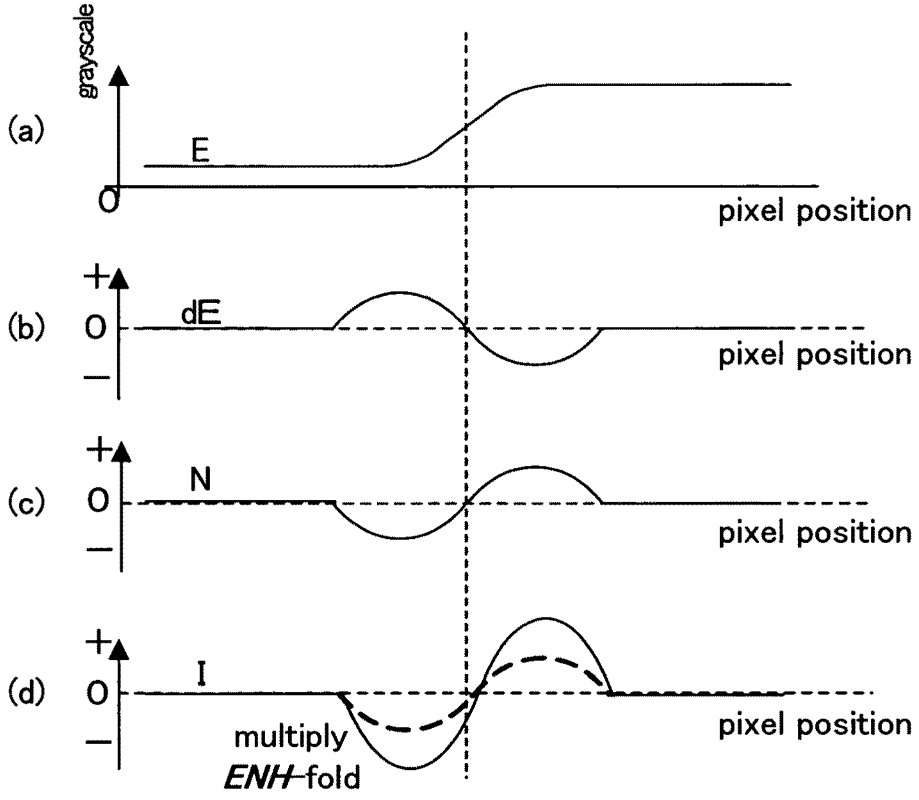
FIG. 13 shows charts for explaining an operation of the high-frequency correction unit in the image display apparatus according to Embodiment 2 of the invention.

An operation of the high-frequency correction-amount generation section 5A will be explained here with reference to FIG. 13.

The image signal E outputted from the gray-level correction section 4A is inputted into the high-frequency-component detection part 5AA of the high-frequency correction unit 5. An example of the image signal E is shown in FIG. 13 (*a*), where the horizontal axis denotes pixel positions and the vertical axis denotes a grayscale. The high-frequency-component detection part 5AA calculates differential values dE of the inputted image signal E. The result of differentiating the signal E in FIG. 13 (*a*) is shown in FIG. 13 (*b*). Moreover, the high-frequency-component detection part 5AA outputs a high-frequency-detected signal N that is obtained by changing the signs of the differential results dE as shown in FIG. 13 (*c*).

The high-frequency-detected signal N outputted from the high-frequency-component detection part 5AA is inputted into the enhancement-amount generation part 5AB. The enhancement-amount generation part 5AB multiplies the high-frequency-detected signal N by a predetermined correction coefficient ENH as shown in FIG. 13 (*d*), to output the multiplication result as the high-frequency-corrected signal I.

Operations of a high-frequency-component detection part 5BA and a enhancement-amount generation part 5BB in a high-frequency correction-amount generation section 5B are the same as those of the high-frequency-component detection part 5AA and the enhancement-amount generation part 5AB, respectively; the explanations of the operations are therefore omitted.

Figure 14:
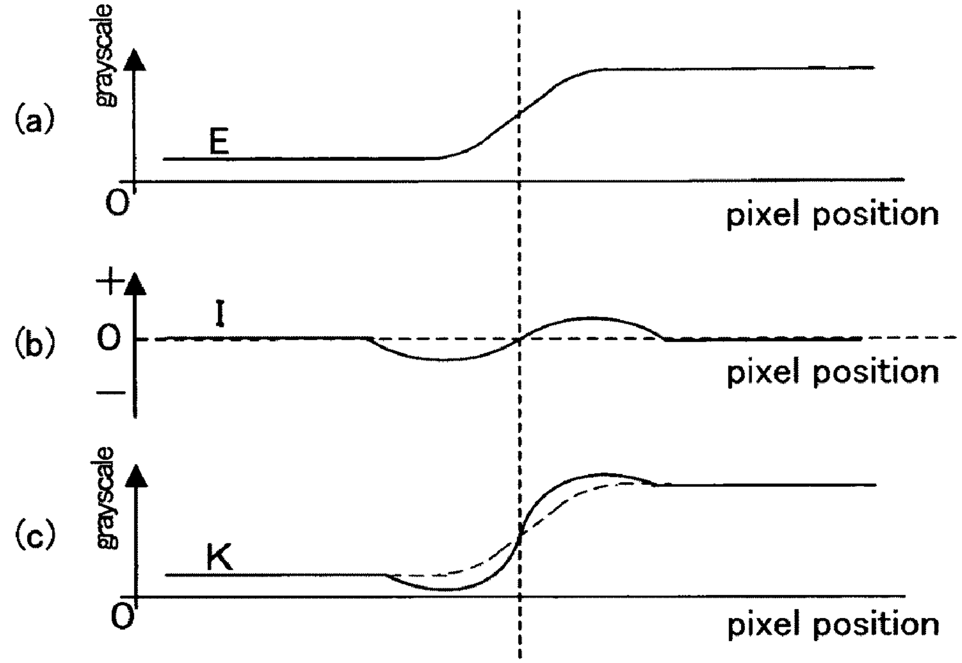
FIG. 14 shows charts for explaining the operation of the high-frequency correction unit in the image display apparatus according to Embodiment 2 of the invention.

FIG. 14 shows charts illustrating the signals inputted into and outputted from the adder 5C. FIG. 14 (*a*) shows the image signal E outputted from the gray-level correction section 4A, and FIG. 14 (*b*) shows the high-frequency-corrected signal I outputted from the high-frequency correction-amount generation section 5A. The adder 5C adds together the image signal E and the high-frequency-corrected signal I, to output the addition result as an image signal K shown in FIG. 14 (*c*).

Figure 15:
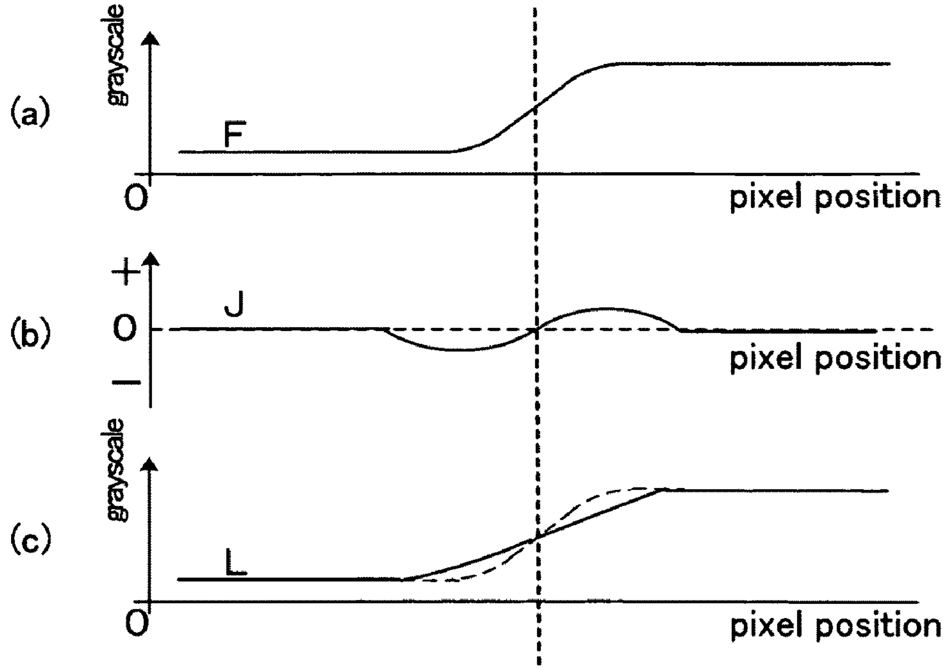
FIG. 15 shows charts for explaining the operation of the high-frequency correction unit in the image display apparatus according to Embodiment 2 of the invention.

FIG. 15 shows charts illustrating the signals inputted into and outputted from the subtracter 5D. FIG. 15 (*a*) shows the image signal F outputted from the gray-level correction section 4B, and FIG. 15 (*b*) shows the high-frequency-corrected signal J outputted from the high-frequency correction-amount generation section 5B. The subtracter 5D subtracts the high-frequency-corrected signal J from the image signal F, to output the subtraction result as an image signal L shown in FIG. 15 (*c*).

The image combining unit 6 combines the image signal K outputted from the adder 5C and the image signal L outputted from the subtracter 5D, to output a combined image signal M into the image display unit 7. Whereas the image display unit 7 displays the combined image signal M while performing the pixel shifting, its explanation is omitted here because the explanation is overlapped with that of the combined image signal G in Embodiment 1.

As explained above, the gray-level correction unit 14 is further provided with the high-frequency correction unit 5 that high-frequency-corrects the image signals E and F, having been corrected from the second image signals C and D, using the high-frequency-corrected signals I and J generated based on high-frequency components of the image signals E and F, respectively: the high-frequency correction is performed by adding the high-frequency-corrected signal I to the image signal E having been corrected by using the grayscale characteristic that makes halftones brighter and by subtracting the high-frequency-corrected signal J from the image signal F having been corrected by using the grayscale characteristic that makes halftones darker. Therefore, without increasing the amount of image signal transmitted to the image display unit per unit time, motion blur, when motion pictures are displayed, can be effectively reduced as well as a sense of resolution, when still pictures are displayed, can be improved.

Embodiment 3

Figure 16:
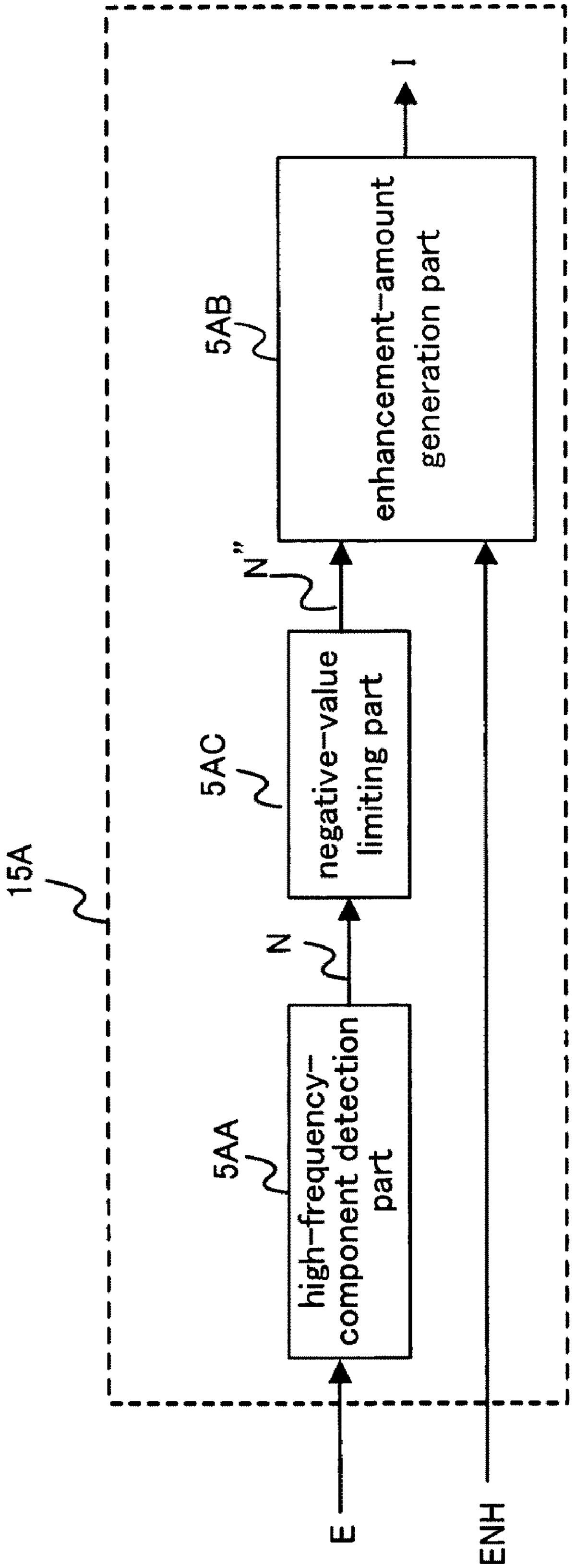
FIG. 16 is a block diagram for explaining in detail a high-frequency correction unit in an image display apparatus according to Embodiment 3 of the present invention.

FIG. 16 is a block diagram illustrating a configuration of a high-frequency correction-amount generation section 15A included in a high-frequency correction unit 5 of Embodiment 3. The difference from the high-frequency correction-amount generation section 5A shown in FIG. 12 in Embodiment 2 is in that a negative-value limiting part 5AC is added at the stage subsequent to the high-frequency-component detection part 5AA. Other constituents are the same as those in Embodiment 2; their explanations are therefore omitted.

Figure 17:
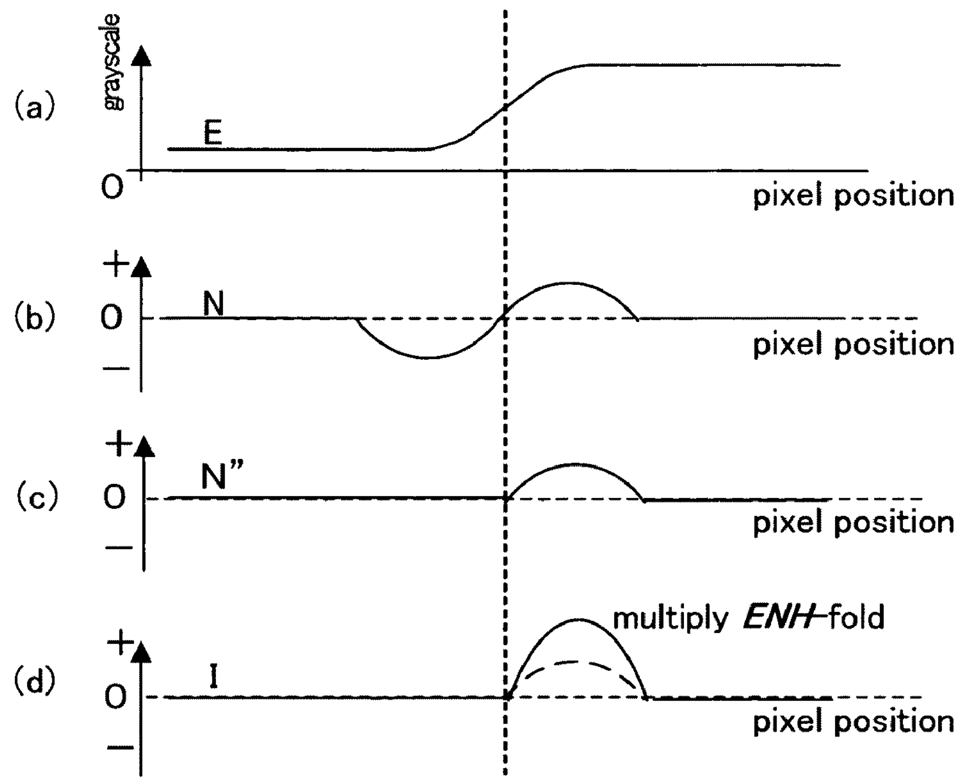
FIG. 17 shows charts for explaining an operation of the high-frequency correction unit in the image display apparatus according to Embodiment 3 of the invention.

An operation of the high-frequency correction-amount generation section 15A is explained here with reference to FIG. 17.

The image signal E outputted from the gray-level correction section 4A to the high-frequency correction unit 5 is inputted into the high-frequency-component detection part 5AA. An example of the image signal E is shown in FIG. 17 (*a*), where the horizontal axis denotes pixel positions and the vertical axis denotes a grayscale. The high-frequency-component detection part 5AA calculates differential values dE of the inputted image signal E, to output a high-frequency-detected signal N that is obtained by changing the signs of the differential results as shown in FIG. 17 (*b*).

The high-frequency-detected signal N outputted from the high-frequency-component detection part 5AA is inputted into the negative-value limiting part 5AC. The negative-value limiting part SAC, as shown in FIG. 17 (*c*), substitutes a value of zero for negative values in the inputted high-frequency-detected signal N, to output the substitution result as a negative-value-limited high-frequency-detected signal N".

The negative-value-limited high-frequency-detected signal N" outputted from the negative-value limiting part 5AC is inputted into the enhancement-amount generation part 5AB. The enhancement-amount generation part 5AB, as shown in FIG. 17 (*d*), outputs as a high-frequency-corrected signal I the result of multiplying the negative-value-limited high-frequency-detected signal N" by a predetermined correction coefficient ENH.

Figure 18:
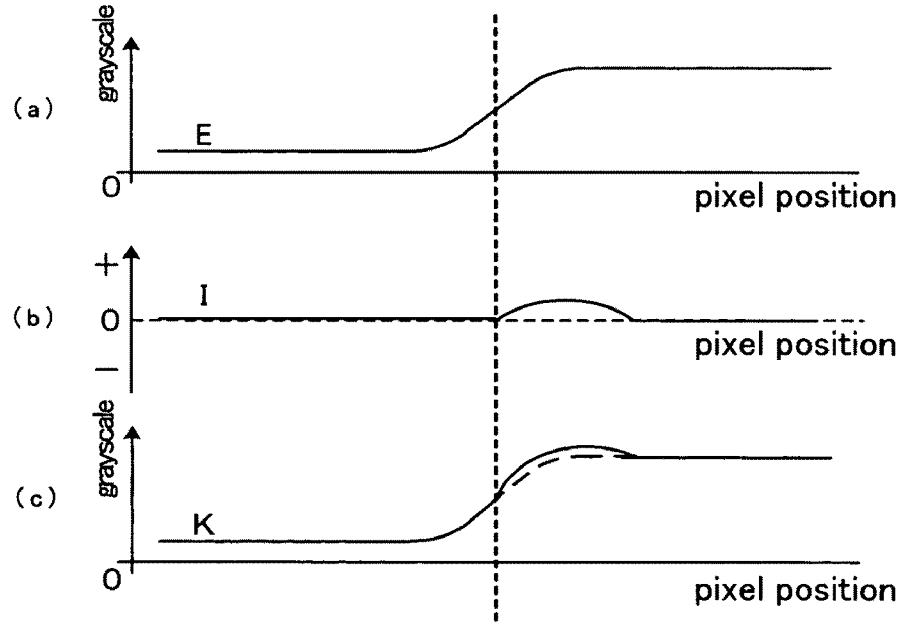
FIG. 18 shows charts for explaining the operation of the high-frequency correction unit in the image display apparatus according to Embodiment 3 of the invention.

FIG. 18 shows charts illustrating signals inputted into and outputted from the adder 5C. FIG. 18 (*a*) shows the image signal E outputted from the gray-level correction section 4A, and FIG. 18 (*b*) shows the high-frequency-corrected signal I outputted from the high-frequency correction-amount generation section 15A. The adder 5C adds together the image signal E and the high-frequency-corrected signal I, to output the addition result as an image signal K shown in FIG. 18 (*c*).

Thereby, the image signal E whose halftones have been corrected to be brighter by the gray-level correction section 4A, in contrast to the output of the adder 5C shown in FIG. 14, is not made darker by the high-frequency-corrected signal I.

Figure 19:
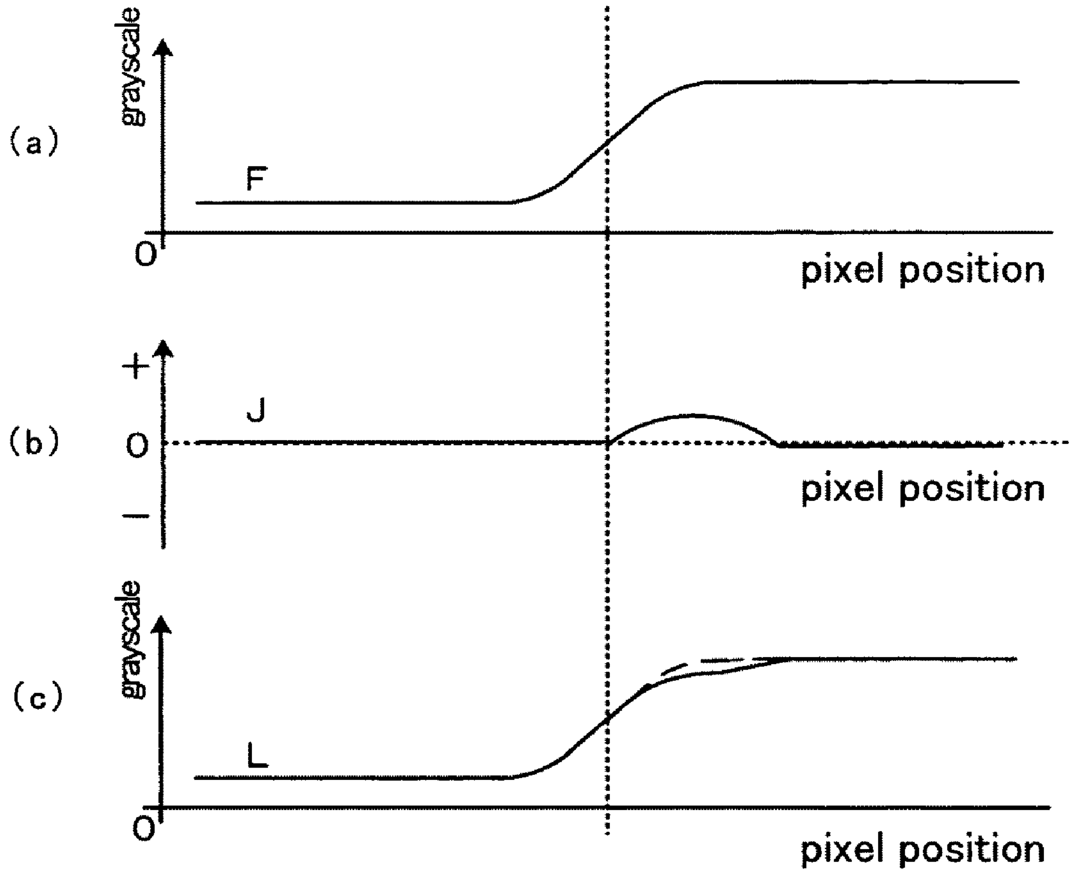
FIG. 19 shows charts for explaining the operation of the high-frequency correction unit in the image display apparatus according to Embodiment 3 of the invention.

FIG. 19 shows charts illustrating signals inputted into and outputted from the subtracter 5D. FIG. 19 (*a*) shows the image signal F outputted from the gray-level correction section 4B, and FIG. 19 (*b*) shows a high-frequency-corrected signal J outputted from the high-frequency correction-amount generation section 15B. The subtracter 5D subtracts the high-frequency-corrected signal J from the image signal F, to output the subtraction result as an image signal L as shown in FIG. 19 (*c*).

Thereby, the image signal F whose halftones have been corrected to be darker by the gray-level correction section 4B, in contrast to the output of the subtracter 5D shown in FIG. 15, is not made brighter by the high-frequency-corrected signal J, so that the integrated amount of swing can be effectively reduced.

As explained above, the high frequency correction unit 15 has negative-value limiting parts 5AC and 5BC that, when negative values are detected in the high-frequency-detected signals N, substitute the value zero for the negative values to output only positive values in the negative-value-limited high-frequency-detected signals N". Therefore, without increasing the amount of image signal transmitted to the image display unit per unit time, motion blur, when motion pictures are displayed, can be effectively reduced as well as a sense of resolution, when still pictures are displayed, can be improved.

What is claimed is:

1. An image display apparatus that displays a frame image by successively displaying sub-frame images consisting of a plurality of respective pixel groups split from the frame image, the image display apparatus comprising:

a sampling unit having at least two sampling phases different from each other, for sampling second image signals from a received image signal at said at least two sampling phases, the second image signals corresponding to the respective at least two sampling phases;

a gray-level correction unit for correcting the second image signals each being split from the received image signal and corresponding to the sub-frames, using respective grayscale characteristics different from sub-frame to sub-frame; and an image display unit for displaying, using a display technique of pixel shifting, the sub-frame images of the image signals that have been corrected by using the respective different grayscale characteristics by the gray-level correction unit.

2. The image display apparatus of claim 1, wherein a high density display of the received image signal is performed using the display technique of pixel shifting by the image display unit having fewer pixels than those in the received image signal.

3. The image display apparatus of claim 1, further comprising an image combining unit for combining the image signals that have been corrected from the second image signals by using the respective different grayscale characteristics by the gray-level correction unit, to output a combined image signal, wherein the image display unit splits the combined image signal into a plurality of third image signals each having the same number of pixels as the image display unit, to display using the pixel shifting the third image signals as image signals corresponding to the respective sub-frame images.

4. The image display apparatus of claim 1, wherein the different sampling phases of the sampling unit correspond to pixel display positions of each sub-frame displayed by the image display unit using the pixel shifting.

5. The image display apparatus of claim 3, wherein the different sampling phases of the sampling unit correspond to pixel display positions of each sub-frame displayed by the image display unit using the pixel shifting.

6. The image display apparatus of claim 1, wherein at least one of the respective grayscale characteristics is a grayscale characteristic that makes halftones in an inputted image signal brighter, and at least another one of the respective grayscale characteristics is a grayscale characteristic that makes halftones in the inputted image signal darker.

7. The image display apparatus of claim 2, wherein at least one of the respective grayscale characteristics is a grayscale characteristic that makes halftones in an inputted image signal brighter, and at least another one of the respective grayscale characteristics is a grayscale characteristic that makes halftones in the inputted image signal darker.

8. The image display apparatus of claim 6, wherein the gray-level correction unit further comprises a high-frequency correction unit for high-frequency-correcting the gray-level-corrected image signals using respective high-frequency-corrected signals generated based on high-frequency components of the respective gray-level-corrected image signals, and the gray-level correction unit performs a high-frequency correction by adding one of the high-frequency-corrected signals that is generated from one of the image signals that has been corrected by using the grayscale characteristic that makes halftones brighter, to the one of the image signals, and by subtracting another one of the high-frequency-corrected signals that is generated from another one of the image signals that has been corrected by using the grayscale characteristic that makes halftones darker, from the another one of the image signals.

9. The image display apparatus of claim 7, wherein the gray-level correction unit further comprises a high-frequency correction unit for high-frequency-correcting the image signals having been gray-level-corrected from the second image signals by respective high-frequency-corrected signals generated based on high-frequency components of the respective image signals having been gray-level-corrected from the second image signals, and the gray-level correction unit performs a high-frequency correction by adding one of the high-frequency-corrected signals that is generated from one of the image signals that has been corrected from its corresponding second image signal by using the grayscale characteristic that makes halftones brighter, to the one of the image signals, and by subtracting another one of the high-frequency-corrected signals that is generated from another one of the image signals that has been corrected from its corresponding second image signal by using the grayscale characteristic that makes halftones darker, from the another one of the image signals.

10. The image display apparatus of claim 8, wherein the high-frequency correction unit further has negative value limiting parts for substituting, when negative values are detected in the high-frequency-corrected signals, a value zero for the negative values to output only positive values.

11. The image display apparatus of claim 9, wherein the high-frequency correction unit further has negative value limiting parts for substituting, when negative values are detected in the high-frequency-corrected signals, the value zero for the negative values to output only positive values.

12. An image processing apparatus adapted for an image display apparatus including an image display unit that displays sub-frame images using a display technique of pixel shifting, the image processing apparatus comprising:

a sampling unit having at least two sampling phases different from each other, for sampling second image signals from a received image signal at said at least two sampling phases;

a gray-level correction unit for correcting the second image signals using respective grayscale characteristics different from each other; and an image combining unit for combining the image signals that have been corrected from the respective second image signals by the gray-level correction unit, to output a combined image signal constituting a frame image, wherein the sub-frame images consists of a plurality of respective pixel groups split from the frame image.

13. An image display method that displays on a display device a frame image by successively displaying sub-frame images consisting of a plurality of respective pixel groups split from the frame image, the image display method comprising:

an image reception step of receiving an image signal;

a sampling step of sampling second image signals from the received image signal at at least two sampling phases different from each other, the second image signals corresponding to the respective at least two sampling phases;

a gray-level correction step of correcting the second image signals each being split from the received image signal and corresponding to the sub-frames using respective grayscale characteristics different from sub-frame to sub-frame; and an image display step of displaying, using a display technique of pixel shifting, on said display device the sub-frame images of the image signals that have been corrected by using the respective different grayscale characteristics in the gray-level correction step.

14. The image display method of claim 13, wherein, in the image display step, a high density display of the received image signal is performed using the display technique of pixel shifting by an image display unit having fewer pixels than those in the received image signal.

15. The image display method of claim 13, further comprising:

an image combining step of combining the image signals that have been corrected from the second image signals by using the respective different grayscale characteristics in the gray-level correction step, to output a combined image signal; and an image signal splitting step of splitting the combined image signal into a plurality of third image signals each having the same number of pixels as an image display unit, wherein in the image display step, the third image signals are displayed using the pixel shifting as image signals corresponding to the respective sub-frame images by the image display unit.

* * * * *